(12) United States Patent
Van Den Brink et al.

(10) Patent No.: US 7,675,606 B2
(45) Date of Patent: Mar. 9, 2010

(54) LITHOGRAPHIC APPARATUS AND METHOD

(75) Inventors: Enno Van Den Brink, Eindhoven (NL); Henricus Wilhelmus Maria Van Buel, Eindhoven (NL); Joseph Consolini, Costa Mesa, CA (US); Gerardus Johannes Joseph Keijsers, Venlo (NL); Klaus Simon, Eindhoven (NL); Johannes Theodoor De Smit, Eindhoven (NL); Richard Joseph Travers, Atkinson, NH (US); Maurice Anton Jaques Teuwen, Weert (NL); Arnout Johannes Meester, Eindhoven (NL); Frederick William Hafner, Effort, PA (US); Vinyu Greenlee, Gilbert, AZ (US); Hubertus Antonius Marinus Baijens, Mierlo (NL)

(73) Assignee: ASML Netherlands B.V., Veldhoven (NL)

( * ) Notice: Subject to any disclaimer, the term of this patent is extended or adjusted under 35 U.S.C. 154(b) by 749 days.

(21) Appl. No.: 11/418,453

(22) Filed: May 5, 2006

(65) Prior Publication Data
US 2007/0258080 A1    Nov. 8, 2007

(51) Int. Cl.
*G03B 27/58*    (2006.01)
*G03B 27/42*    (2006.01)
(52) U.S. Cl. .......................... 355/72; 355/53
(58) Field of Classification Search ............ 355/72, 355/73, 53; 451/54; 430/322; 279/3
See application file for complete search history.

(56) References Cited

U.S. PATENT DOCUMENTS

| | | | | |
|---|---|---|---|---|
| 5,662,400 | A | 9/1997 | Shikama et al. | 353/31 |
| 6,137,562 | A * | 10/2000 | Masuyuki et al. | 355/73 |
| 6,583,858 | B2 | 6/2003 | van Schaik et al. | 355/72 |
| 6,966,560 | B2 | 11/2005 | Demel et al. | 279/3 |
| 2001/0016302 | A1* | 8/2001 | Hirayanagi et al. | 430/322 |
| 2002/0185644 | A1 | 12/2002 | Thallner | 257/48 |
| 2005/0181711 | A1* | 8/2005 | Starikov et al. | 451/54 |
| 2006/0046269 | A1* | 3/2006 | Thompson et al. | 435/7.1 |

FOREIGN PATENT DOCUMENTS

| | | |
|---|---|---|
| EP | 1 091 389 A2 | 4/2001 |
| EP | 1 207 548 A2 | 5/2002 |
| EP | 1 380 898 A1 | 1/2004 |
| EP | 1 091 389 A3 | 2/2005 |
| EP | 1 207 548 A3 | 11/2005 |
| JP | 03-102849 | 4/1991 |

OTHER PUBLICATIONS

European Search Report issued for European Patent Appln. No. 07251894.7-1226, dated Sep. 3, 2007.

* cited by examiner

*Primary Examiner*—Peter B Kim
(74) *Attorney, Agent, or Firm*—Pillsbury Winthrop Shaw Pittman, LLP

(57) ABSTRACT

According to one of the aspects of the present invention there is provided a substrate carrier arranged to hold a substrate in position using a vacuum, the vacuum being established in a sealed space created between the substrate carrier and the substrate.

30 Claims, 7 Drawing Sheets

LITHOGRAPHIC APPARATUS AND METHOD

FIELD

The present invention relates to a substrate carrier and methods of using the substrate carrier.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

Traditionally, substrates used in lithography have been one of a relatively small number of sizes and shape. For example, a traditional substrate may be substantially circular in shape, with a diameter of 200 mm (8 inches) or 300 mm (12 inches). The substrate may be, for example, 200 μm thick. However, as technologies which use and depend on lithography develop, the shapes and sizes of substrates used has also changed. Substrates used in modern lithography may be very thin (for example 50 μm, 40 μm or less), have pits (cavities) in the underside of the substrate, have slots through the substrate or have extremely high bow or warp. Substrates may have rims around their perimeter. The substrates may be irregularly shaped (i.e. non-circular, for example square in shape). In short, the shape and size of substrates used in modern lithography are evolving with the technology which uses the substrates.

In order to accommodate different shapes and sizes of the substrates, lithographic apparatus used to pattern the substrates may need to be modified, or new lithographic apparatus created. For example, some lithographic apparatus incorporates equipment which is specifically shaped for dealing with certain sized substrates. Thus, without modification, such lithographic apparatus cannot be used to apply patterns to a non-standard sized (i.e. a non-traditional) substrate.

A proposed way of overcoming some of the problems of using existing lithographic apparatus to apply a pattern to a non-traditional substrate is the use of what is known in the art as an intermediate substrate carrier (or substrate carrier, for short).

SUMMARY

It is an object of the present invention to provide a novel substrate carrier and a novel method of using a substrate carrier.

According to a first aspect of the invention, there is provided a substrate carrier arranged to hold a substrate in position using a vacuum, the vacuum being established in a sealed space created between the substrate carrier and the substrate.

According to a second aspect of the invention, there is provided a method of releasably securing a substrate to a substrate carrier comprising: positioning a substrate on the substrate carrier so that a sealed space is defined between the substrate and the substrate carrier; connecting the substrate carrier to a vacuum source to establish a vacuum in the space between the substrate and the substrate carrier.

According to a third aspect of the invention, there is provided a lithographic processing method comprising: introducing a substrate and substrate carrier into a lithographic apparatus while the substrate is held in position on the substrate carrier using a vacuum; applying a pattern to the substrate using optical lithography; and removing the substrate and substrate carrier from the lithographic apparatus while the substrate is still held in position on the substrate carrier using the vacuum.

According to a fourth aspect of the invention, there is provided a method of controlling a lithographic apparatus, the apparatus comprising: a substrate positioning apparatus for positioning a substrate onto a substrate carrier and removing the substrate from the substrate carrier; and an exposure area, where the substrate is to be exposed to a radiation beam; the method comprising: positioning the substrate onto the substrate carrier using the substrate positioning apparatus, releasably securing the substrate to the substrate carrier; moving the substrate carrier with the substrate positioned thereon to the exposure area for exposure by the radiation beam; exposing the substrate to the radiation beam; moving the substrate carrier with the substrate positioned thereon to the substrate positioning apparatus; releasing the substrate from the substrate carrier; and removing the substrate from the substrate carrier using the substrate positioning apparatus.

According to a fifth aspect of the invention, there is provided a substrate carrier, wherein the substrate carrier is provided with at least one alignment mark.

According to a sixth aspect of the present invention, there is provided a substrate carrier for holding a substrate, wherein the substrate carrier is provided with at least one window through which at least a part of the substrate can be viewed when the substrate is held in position on the substrate carrier.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, micro electro mechanical systems (MEMS), etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to a device that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure supports, i.e. bears the weight of, the patterning device. It holds the patterning device in a way depending on the orientation of the patterning device, the design of the lithographic apparatus, and other conditions, such as for example whether or not the patterning device is held in a vacuum environment. The support can be using mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

DESCRIPTION OF THE DRAWINGS

Embodiments of the invention will now be described, by way of example only, with reference to the accompanying schematic drawings in which corresponding reference symbols indicate corresponding parts, and in which.

EMBODIMENTS

Figure 1:
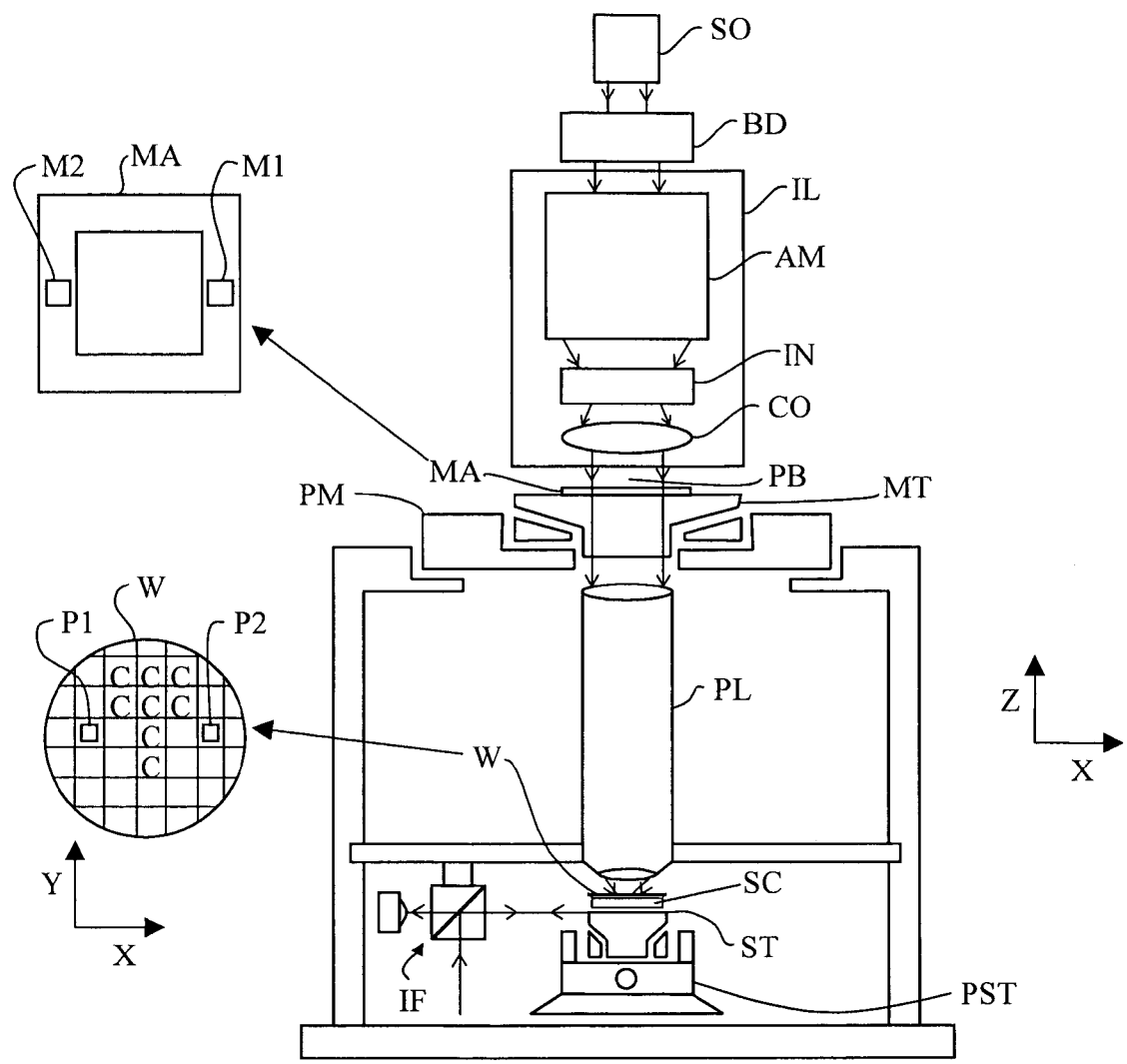
FIG. 1 depicts a lithographic apparatus provided with a substrate carrier according to an embodiment of the invention.

FIG. 1 schematically depicts a lithographic apparatus according to a particular embodiment of the invention. The apparatus comprises: an illumination system (illuminator) IL for providing a projection beam PB of radiation (e.g. UV radiation or EUV radiation); a first support structure (e.g. a mask table) MT for supporting a patterning device (e.g. a mask) MA and connected to a first positioner PM for accurately positioning the patterning device with respect to item PL; a substrate table ST for holding a substrate carrier SC, the substrate table being connected to a second positioner PST for accurately positioning the substrate table ST (and thus the substrate carrier SC) with respect to item PL; and a substrate carrier SC for holding a substrate (e.g. a resist-coated wafer) W. (The substrate carrier SC is a structure which is readily removable from the lithographic apparatus and introducible into the lithographic apparatus. In certain circumstances the substrate carrier SC may be introduced to and removed from the lithographic apparatus while still holding the substrate); and a projection system (e.g. a refractive projection lens) PL for imaging a pattern imparted to the projection beam PB by the patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise an adjustor AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation, referred to as the projection beam PB, having a desired uniformity and intensity distribution in its cross-section.

The projection beam PB is incident on the mask MA, which is held on the mask table MT. Having traversed the mask MA, the projection beam PB passes through the lens PL, which focuses the beam onto a target portion C of the substrate W. With the aid of the second positioner PW and position sensor IF (e.g. an interferometric device), the substrate table ST can be moved accurately, e.g. so as to position different target portions C in the path of the beam PB. Similarly, the first positioner PM and another position sensor (which is not explicitly depicted in FIG. 1) can be used to accurately position the mask MA with respect to the path of the beam PB, e.g. after mechanical retrieval from a mask library, or during a scan. In general, movement of the object tables MT and ST will be realized with the aid of a long-stroke module (coarse positioning) and a short-stroke module (fine positioning), which form part of the positioners PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table ST are kept essentially stationary, while an entire pattern imparted to the projection beam is projected onto a target portion C in one go (i.e. a single static exposure). The substrate table ST is then shifted in the X and/or Y direction so that a different target portion C can be exposed. In step mode, the maximum size of the exposure field limits the size of the target portion C imaged in a single static exposure.

2. In scan mode, the mask table MT and the substrate table ST are scanned synchronously while a pattern imparted to the projection beam is projected onto a target portion C (i.e. a single dynamic exposure). The velocity and direction of the substrate table ST relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table ST is moved or scanned while a pattern imparted to the projection beam is projected onto a target portion C. In this mode, generally a pulsed radiation source is employed and the programmable patterning device is updated as required after each movement of the substrate table ST or in between successive radiation pulses during a scan. This mode of operation can be readily applied to maskless lithography that utilizes programmable patterning devices, such as a programmable mirror array of a type as referred to above.

Combinations and/or variations on the above described modes of use or entirely different modes of use may also be employed.

In known lithographic apparatus, a substrate may be fixed in position on the substrate table using a vacuum. In use, the substrate is loaded onto the substrate table and a vacuum is established between the substrate table and the substrate which holds the substrate in position. While this is a conventional and acceptable method for fixing thick or regularly shaped substrates in position on the substrate table, it is not always appropriate for thin and irregularly shaped substrates. A conventional substrate table will in general be designed to accommodate a conventional substrate (for example, 200 µm thick and 200 mm (8 inches) or 300 mm (12 inches) in diameter). The substrate table will often have an array of burls upon which the substrate rests, the spaces between the burls being evacuated to hold the substrate in position. The substrate table may also have a recess shaped to accommodate a regularly shaped substrate. If a thin substrate is to be held in position using a conventional substrate table, the conventional array of burls may be too coarse (i.e. the burls are spaced too far apart from one another) to adequately support the substrate. Without adequate support, the thin substrate may bend and become warped. Such warping makes it difficult or impossible to apply an accurate pattern to target portions of the substrate. The substrate may even become permanently damaged as a result of the bending. If the shape of the substrate is unconventional (e.g. square), a recess provided in the conventional substrate table may not be suited for accommodating the substrate. This may prevent a sufficient vacuum being established between the substrate and the substrate table, and thus prevent the substrate from being held in position on the substrate table.

In other known lithographic apparatus, an irregular substrate to be exposed is bonded to a substrate carrier (e.g. a conventional substrate in this case). The substrate carrier and substrate bonded to the substrate carrier are loaded into the lithographic apparatus and placed on the substrate table. A vacuum is established between the substrate table and substrate carrier such that the substrate carrier (and thus the substrate) is held in position relative to the substrate table. The substrate is exposed, and then the vacuum is removed. The substrate and substrate carrier to which it is bonded may then be removed from the substrate table. Before and/or after exposure of the substrate, additional processing may take place while the substrate is bonded to the substrate carrier. While the bonding of the irregular substrate to the substrate carrier may allow the irregular substrate to be exposed (etc.) using apparatus configured to accommodate a standard substrate, bonding is not always an ideal solution. For example, once bonded to the substrate carrier, it is difficult to reposition the substrate (if necessary). Furthermore, removal of a substrate bonded to a substrate carrier is not straightforward and may require special tools or processing steps. To bond the irregular substrate to the substrate carrier requires processing steps (e.g. a gluing and curing step), which can introduce undesirable time delays in the processing of the substrate, and increase the possibility of contaminating the lithographic apparatus.

Referring to FIG. 1, the substrate W is illustrated as being fixed to an intermediate substrate carrier SC (hereinafter referred to as the substrate carrier SC) which embodies the invention. The substrate carrier SC is held in position by the substrate table ST using a vacuum. The substrate table ST is provided with mirrors (not shown) which form part of an interferometric device IF used to accurately position the substrate table ST, and consequently the substrate carrier SC and substrate W which is attached thereto.

The substrate carrier SC of FIG. 1 is readily removable from the lithographic apparatus and introducible into the lithographic apparatus in much the same way as a conventional substrate. The substrate carrier SC holds the substrate W in position using a vacuum (in a manner described in more detail below), such that the substrate carrier SC and substrate W can be moved around without the substrate W becoming detached from the substrate carrier SC. Thus, as the substrate carrier SC is readily removable from and introducible into the lithographic apparatus, the substrate W can be introduced into the lithographic apparatus and removed from the lithographic apparatus while it is attached to the substrate carrier SC. This allows processing of the substrate W prior to and/or after exposure in the lithographic apparatus to be undertaken while the substrate W is attached to (using a vacuum) and supported by the substrate carrier SC. Furthermore, this obviates the need to bond the substrate to the substrate carrier. However, it will be appreciated that in some circumstances, it may be desirable to process the substrate W when it is not attached to the substrate carrier SC.

Figure 2A:
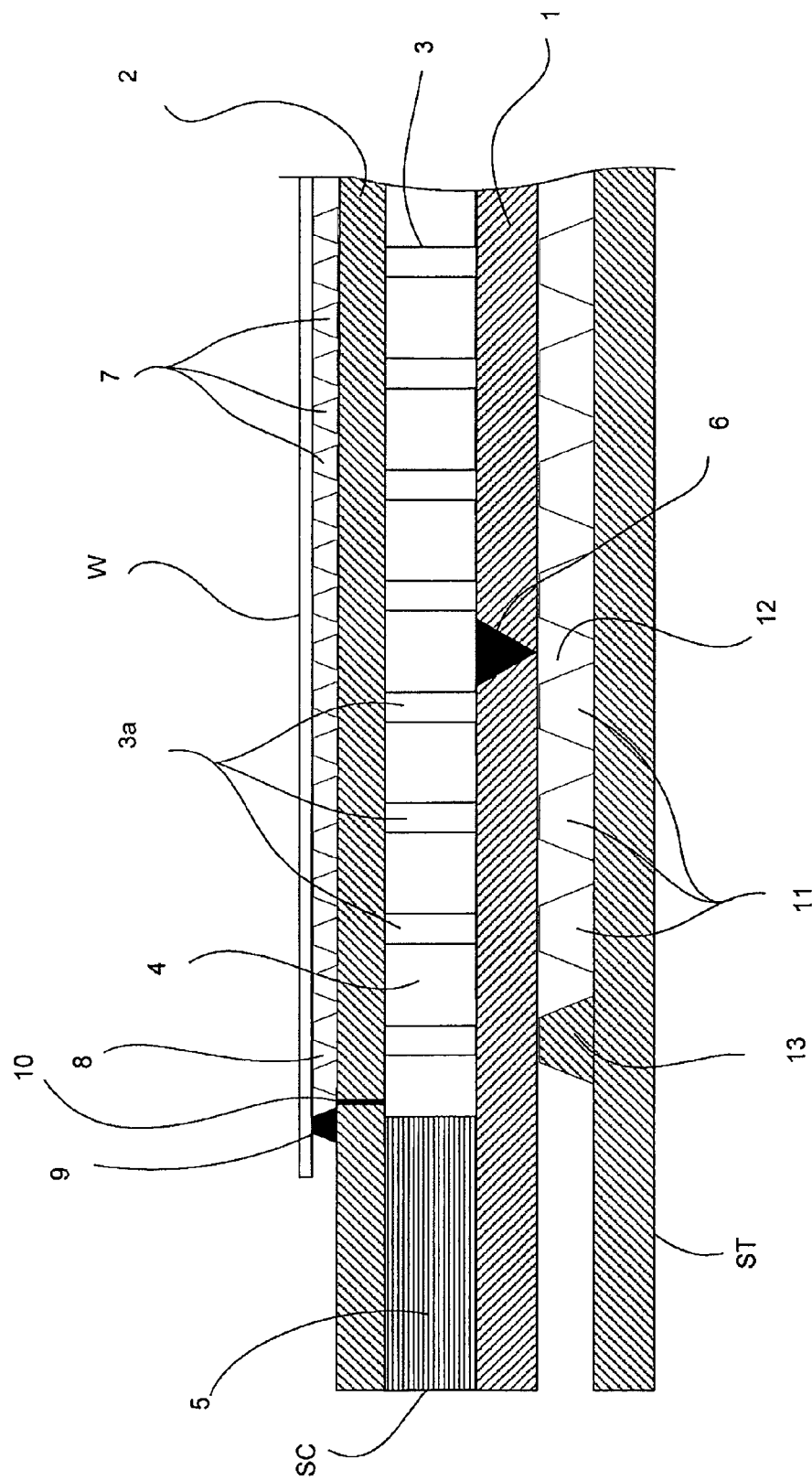
FIGS. 2a and 2b depict the substrate carrier of FIG. 1 in more detail.

FIG. 2a depicts part of the substrate carrier SC of FIG. 1 in more detail. The substrate carrier SC is shown in relation to the substrate W and the substrate table ST. The substrate W, substrate carrier SC and substrate table ST form a stack, in that the substrate carrier SC is positioned on the substrate table ST, and the substrate W is positioned on the substrate carrier SC.

The substrate carrier SC is formed from two glass plates, a lower plate 1 and an upper plate 2. The upper plate 2 is separated from the lower plate 1 by a support structure 3. The support structure 3 comprises an array of columns 3a which extend from the lower plate 1 to the upper plate 2. Due to the presence of the array of columns 3a, there is a space 4 which extends around and about the array of columns 3a. The space 4 formed between the upper plate 2 and lower plate 1 is sealed by a perimeter seal 5 that extends around the perimeter of the upper and lower plates 2, 1 and is disposed between the upper and lower plates 2, 1. In the centre of the lower plate 1 there is a hole, which is sealed with a one way valve 6, which is arranged to allow fluid (such as air) to leave the space 4 between the lower and upper plates 1, 2. The upper plate 2 is provided with a dense array of burls 7 to support the wafer W and keep it flat. The dense array of burls 7 ensures that there is a space 8 between the substrate W and the upper plate 2.

The burls in the array 7 are about 10 μm high, and have a diameter of about 150 μm. The array of burls 11 have a pitch of about 1 mm. It will be appreciated that the burls of the array 7 may be any suitable size and distributed in any suitable fashion. For example, the burls of the array 7 may be between about 5 μm and about 50 μm high. The burls in the array may be between about 100 μm and about 500 μm in diameter. The array of burls 11 may have a pitch of between about 0.5 mm and about 2 mm.

The space 8 is sealed by a ring seal 9, which extends around the perimeter of the array of burls 7, and is the same height as the array of burls 7. The ring seal 9 thus seals the space 8 between the wafer W and the upper plate 2. The space 8 between the substrate W and upper plate 2 is connected to the space 4 between the upper and lower plates 2,1 by an array of small apertures 10 located adjacent to the ring seal 9.

The apertures 10 allow a vacuum established in the space 4 within the substrate carrier SC to also be established in the space 8 between the substrate carrier SC and the substrate W. The apertures 10 are sufficiently large to allow a vacuum to be established in the space 8 between the substrate carrier SC and the substrate, in a short period of time, thus fixing the substrate W in position on the substrate carrier SC in a short period of time. In the present embodiment, the apertures are circular, and have a diameter of about 0.9 mm. It will be appreciated that any suitable number or type of apertures may be used, and those apertures may be distributed in any appropriate manner. The apertures may, for example, be located near the centre of the substrate carrier SC, or in a location adjacent the periphery of a substrate W when positioned on the substrate carrier SC. The apertures may have any suitable diameter. For example, the apertures may have a diameter of between about 0.5 mm and about 1.5 mm.

The wafer table ST is provided with a coarse array of burls 11 to support the substrate carrier SC and keep it flat. The array of burls 11 is 'coarse' in that 11 is greater than the spacing between burls in the array 7 of the substrate carrier. A space 12 is defined between the coarse array of burls 11, and thus between the substrate table ST and the lower plate 1 of the substrate carrier SC. This space 12 is sealed by provision of a substrate table seal ring 12 which extends around the perimeter on the coarse array of burls 11. The burls in the array 11 are about 350 μm high, and have a diameter of about 500 μm. The array of burls 11 have a pitch of about 3 mm. It will be appreciated that the burls of the array 11 may be any suitable size and distributed in any suitable fashion. For example, the burls of the array 11 may be between about 100 μm and about 500 μm high. The burls in the array maybe between about 300 μm and about 1000 μm in diameter. The array of burls 11 may have a pitch of between about 2 mm and about 5 mm.

It can be seen from FIG. 2a that the array of burls 7 provided on the upper plate 2 of the substrate carrier SC is denser (or has a smaller pitch) than the coarse array of burls 11 provided on the substrate carrier ST. It can also be seen that the substrate carrier SC has been positioned relative to the substrate table ST in such a way that the array of columns 3a of the substrate carrier SC are in alignment with the coarse array of burls 11 of a substrate table ST. The significance of these features will be described in more detail below.

In use, the substrate carrier SC is placed on top of the coarse array of burls 11 of the substrate table ST. The substrate W is then placed on top of the array of burls 7 provided on the upper plate 2 of the substrate carrier SC. The space 12 between the substrate table ST and the substrate carrier SC is then evacuated. Evacuation of this space 12 causes the one way valve 6 to open, while in part pulling the substrate carrier SC towards the substrate table ST to fix it in position. When the one way valve 6 is opened, the space 4 between the upper and lower plates 2, 1 of the substrate carrier is also evacuated. Since the space 4 between the upper and lower plates 2,1 of a substrate carrier SC is in communication with the space 8 between the substrate carrier SC and substrate W, the space 8 between the substrate carrier SC and the substrate W is also evacuated. Evacuation of the space 8 between the substrate carrier SC and the substrate W causes the substrate W to be fixed in position on the array of burls 7 of the substrate carrier SC. Thus, by establishing a vacuum in the space 12 between the substrate carrier SC and the substrate table ST, the substrate W is held in position on the substrate carrier SC, and the substrate carrier is held in position on the substrate table ST.

It will be appreciated that the substrate may already be held in position on the substrate carrier SC when the substrate carrier is placed on the burls 11 of the substrate table ST. A vacuum applied to the space 12 between the substrate carrier SC and the substrate table ST will then maintain, or 'top up' the vacuum between the substrate carrier SC and the table, as explained further below.

The strength of the vacuum for holding the substrate W in position on the substrate carrier SC may be dependent on properties of the substrate W. For example, for some substrates, the substrate W may not be held in position on the substrate carrier SC if the vacuum decreases below about 3 millibar. A vacuum of about 400 millibar to about 500 millibar in the space 8 between the substrate W and the substrate carrier SC is considered sufficient to hold the substrate W in position. In order to achieve this, a vacuum of about 600 millibar may need to be established in the space 12 between the substrate carrier SC and substrate table WT, and also in the space 4 within the substrate carrier SC. As will be described below, when the substrate carrier SC is not connected to a vacuum source, the vacuum will leak. If the vacuum decreases below 3 millibar, the substrate W may not be held in position on the substrate. The vacuum may need to be maintained, or "topped-up".

To remove the substrate W from the substrate carrier SC, the one way-valve 6 may be opened without the use of a vacuum. For example, a mechanical element may be used to open the one-way valve, or a magnetic or electrostatic force may be applied to the one way valve 6 to open it. The substrate table WT may be provided with such a valve opening device, as could any device which is used to handle the substrate carrier SC. Alternatively, the valve opening device may be an independent piece of apparatus.

If a thin substrate W was held in position on the burls 11 of the substrate table ST, the thin substrate W might become warped due to the large pitch (inter-burl separation) of the array of burls 11. By providing a substrate carrier SC with an array of burls 7 having a finer pitch, the thin substrate W may be held in position without bending or warping.

As shown in FIG. 2a, the substrate carrier SC is positioned such that the columns 3a that separate the upper and lower plates 2,1 are in direct alignment with the array of burls 11 on the substrate carrier ST. By positioning the substrate carrier ST in this manner, forces induced by the establishment of a vacuum in the space 12 between the substrate carrier and the substrate table ST are, in general, transmitted through the columns 3a. Thus, the columns 3a not only separate the upper plate 2 and lower plate 1 of a substrate carrier, but they also serve to prevent the upper and lower plates 2, 1 from becoming warped due to forces induced by establishment of a vacuum in the space 11 between the substrate carrier SC and the substrate table ST. The columns 3a also serve to reinforce the structure of the substrate carrier SC, for example against compressive forces induced by the establishment of a vacuum in the space 4 between the lower and upper plates 1, 2 of the substrate carrier.

In some circumstances, it is possible that particulate contamination may be deposited (unintentionally) on top of the burls 11 of the substrate table ST. If such contamination is deposited, the substrate carrier SC would not lie flat on the burls 11 of the substrate table ST, but would instead be lifted slightly away from the substrate table ST by the contamination. It is desirable for the substrate carrier to lie as flat as possible on the array of burls 11 of a substrate table ST, even when contamination is present. To make the substrate W lie as flat as possible on the substrate table WT, the substrate carrier SC may be positioned such that the columns 3a are in alignment with the spaces between burls 11 of the substrate table ST. Such positioning allows the plates 1,2 of the substrate carrier SC to bend slightly, and flex around the particulate contamination. Although the substrate carrier SC may not lie perfectly flat on the burls 11 of the substrate table ST, positioning of a substrate carrier SC such that the columns 3a are in alignment with spaces between burls 11 of a substrate table ST may ensure that the substrate carrier SC is flatter than if the substrate carrier SC was positioned such that the columns 3a were in direct alignment with the burls 10 of the substrate table ST.

As described above, the valve 6 in the lower plate 1 of the substrate carrier SC is a one way valve 6. Thus, even when a vacuum is no longer established in the space 12 between the substrate carrier SC and the substrate table ST, no air may enter the space 4 in the substrate carrier SC. Since no air may enter the substrate carrier SC due to the presence of the one way valve 6, a vacuum is maintained between the substrate carrier SC and the substrate W even when no vacuum is established in the space 12 between in substrate carrier SC and the substrate table ST. As a consequence of this feature, once a vacuum has been established in the space 4 of the substrate carrier SC which is sufficient to hold the substrate W in position on top of the burls 7 located on top of the substrate carrier SC (e.g. greater than 3 millibar), the substrate carrier SC can be removed from the substrate table ST while not affecting the positioning of the substrate W on the substrate carrier SC (i.e. the substrate remains fixed in position by vacuum induced forces). Thus, the substrate carrier SC can be removed from the substrate table ST and moved to other parts of the lithographic apparatus (or indeed any other apparatus) without the substrate W becoming detached from the substrate carrier SC.

It will be appreciated that even though a vacuum has been established which is sufficient to keep the substrate W in position on the substrate carrier SC with no active source of evacuation (i.e. when the substrate carrier has been removed from the substrate table ST), air may leak into the space 8 between the substrate W and the substrate carrier SC and destroy the vacuum. For example, air may leak through or past seal 9, which is disposed on the substrate carrier SC. To overcome this problem, the substrate carrier SC can be periodically positioned on a vacuum source. The vacuum source may be for example a vacuum provided by the substrate table ST, a vacuum chuck on a robot arm used to move the substrate carrier SC, or any other tool which may evacuate the space 4 in the substrate carrier SC and thus the space 8 between the substrate carrier SC and the substrate W via the one way valve 6. This maintains the vacuum between the substrate carrier SC and the substrate W, thus keeping the substrate W in position on the substrate carrier SC. Such periodic positioning of the substrate carrier on a vacuum source may be undertaken in normal processing procedures, for example when the substrate carrier SC is being moved from a first position within the lithographic apparatus to a second position within the lithographic apparatus. Alternatively or in addition, the substrate carrier SC may be structurally modified to improve its vacuum retaining properties, as exemplified by FIG. 2b.

Figure 2B:
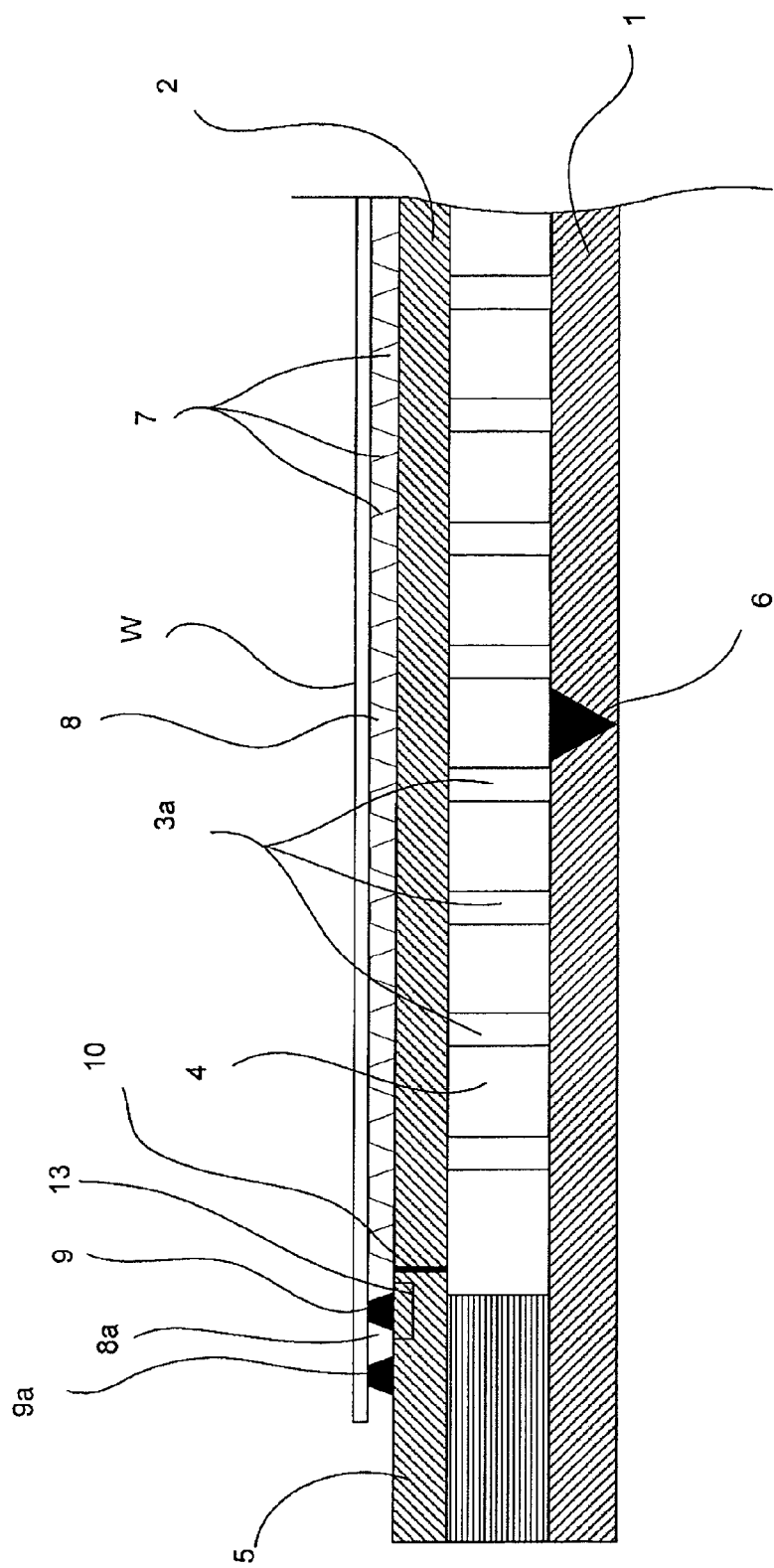

FIG. 2b illustrates a structural modification of the substrate carrier SC of FIG. 2a to improve its sealing properties. FIG. 2b shows the substrate W on the burls 7 of the substrate carrier SC. The substrate carrier SC of FIG. 2b is, in general, the same as the substrate carrier shown in FIG. 2a. However, the substrate carrier SC of FIG. 2b is provided with an additional seal 9a which also extends around the array of burls 7 on the upper plate 2 of the substrate carrier SC. The seal 9 and additional seal 9a are adjacent to one another, and define a ring shaped space 8a between the seals 9, 9a. The ring shaped space 8a is connected to the space 8 surrounding the burls 7 by an array of apertures 13 which extends through the upper plate 2 of the substrate carrier SC. Thus, when a vacuum is established in the space 8 between the burls 7 of the substrate carrier SC, space 8a between the seals 9, 9a is also evacuated.

Measurements have shown that leakage from a vacuum seal can be controlled by reducing the pressure difference over the seal. The total pressure difference is divided over the number of vacuum seals. The pressure difference over each seal is controlled by the diameter of the apertures 13 through which air is evacuated. Thus, by providing apertures 13 with an appropriate diameter, the pressure difference between the space 8 surrounding the burls 7 and the space 8a between the seals 9, 9a can be made to be less than the pressure difference between the space 8 surrounding the burls 7 and atmospheric pressure. Such a reduced pressure difference will ensure that the seals 9, 9a as a whole do not leak as much as a single seal would. The space 8a between the adjacent ring seals 9, 9a may be connected directly to the space 4 in the substrate carrier. The pressure difference may then be controlled by appropriate selection of apertures used to make such a connection.

The apertures 13 may be any suitable size and shape. In the present embodiment, the apertures are circular in cross section, and have a diameter of between 0 mm and 0.5 mm. The inventors have found that the smaller the diameter of the apertures, the better the seal. For example, the inventor s have found that when there are no apertures connecting the space between the ring shaped space 8a and the space 8 surrounding the burls 7, the only leakage is that across the seals 9 and 9a and this leads to an increase in the time for which the substrate W is held in position on the substrate carrier SC. The substrate carrier SC may be provided with more than two seals 9, 9a, to provide more than one ring-shaped space 8a. As the number of seals is increased, the pressure difference across each individual seal is reduced, thereby reducing the leakage of the vacuum and increasing the time for which the substrate W is held on the substrate carrier SC.

It will be appreciated that the location of the seals 9, 9a may correspond to the outer diameters of the substrate W to be held in position on the substrate carrier SC, so that that force applied to the substrate W is spread over the maximum possible area. It will also be appreciated that, for smaller substrates, a substrate carrier SC having a different configuration and distribution of seals may be required. Therefore, a plurality of substrate carriers SC having different seal configurations may be used for substrates of different sizes and shapes.

The substrate carrier SC has been described as being formed from two glass plates 1,2. However, it will be appreciated that any suitable material may be used to construct the substrate carrier SC, so long as a substrate W can be held in position on the substrate carrier SC using a vacuum, while not substantially distorting the shape of the substrate carrier SC. Similarly, the shape, size and configuration of the array of burls 7 and columns 3a of the substrate carrier SC may be any suitable configuration. For example, the array of burls 7 may be of any shape or configuration which allows, for example, a thin substrate to be adequately supported and maintained in an unbent fashion. The columns 3a, or any appropriate supporting structure 3, may be of any suitable configuration which reinforces the structure of the substrate carrier. For example, the supporting structure may comprise an array of interconnected walled chambers.

The one-way valve 6 shown in FIG. 2a may be any suitable one-way valve, so long as when a vacuum is applied to the one-wave valve 6, it is activated so that a vacuum may ultimately be established within the space 4 in the substrate carrier SC.

The substrate carrier SC may be any suitable shape. The substrate carrier may be the same shape as a standard substrate, so that standard lithographic apparatus may be used to handle the substrate carrier SC in the same way in which a conventional substrate W would be handled. The substrate carrier SC may be suitably shaped so that the substrate W may be processed and moved around the lithographic apparatus while still attached to the substrate carrier. For example, the substrate carrier SC may be 2 mm thick. The substrate carrier may be shaped so as to accommodate a substrate that is provided with protrusions or indentations. For example, some substrates are provided with a rim that extends around the periphery of the substrate, and which is thicker than a central region of the substrate where patterning takes place. The substrate may be handled using the rim, so that damage to the thin central section of the substrate is avoided.

As opposed to being provided with a single space 4, the substrate carrier SC may be provided with a plurality of sealed spaces. Each sealed space will be connected to a corresponding sealed space between the substrate W and the substrate carrier SC. Each sealed space in the substrate carrier SC will be provided with a one-way valve. By providing a substrate carrier having these features different sealed spaces can be evacuated to, for example, hold in position substrates of different sizes, or a plurality of substrates or substrate pieces.

The substrate carrier SC may be configured such that a vacuum is only applied to the edge of the substrate W. For example, a vacuum may be applied to the edge of the substrate W by connecting the space 4 in the substrate carrier SC to the space 8a provided between the seals 9, 9a which are located in such a position to be adjacent the edge of the substrate W.

An alternative substrate carrier could be a plate provided with a one-way valve and an array of protrusions. The one way valve would allow evacuation of a space between a substrate and the substrate carrier when the substrate is positioned on the protrusions. This simplified carrier (when compared with that of FIG. 2a) would be equivalent to the upper plate 2 of the substrate carrier SC described in relation to FIG. 2a, but with a one-way valve provided therein. The substrate carrier SC of FIG. 2a has a larger volume in which to 'store' a vacuum (i.e. in the space 4) than the simplified substrate carrier. Therefore the substrate carrier SC of FIG. 2a may hold the substrate W in position for longer than the simplified carrier, since for a given vacuum leakage rate, the substrate carrier SC of FIG. 2a has more vacuum to lose before the vacuum decreases to a level not sufficient to hold the substrate in position.

By using a substrate carrier SC which utilizes a vacuum to fix a substrate W in position, the substrate W can be repositioned easily by construction or destruction of a vacuum. In contrast, in the prior art, substrates are bonded to substrate carriers using glues, which make it difficult to reposition the substrate and increase the possibility of introducing contamination into the lithographic apparatus.

When a pattern is to be projected onto a substrate by the lithographic apparatus, alignment measurements are used to ensure that the substrate is in the correct position. However, when a substrate carrier is used to, for example, hold an irregularly shaped substrate, it may be difficult to determine the relative alignment between the substrate carrier and the substrate. It is advantageous to know the relative position of the substrate on the substrate carrier, as this may help to ensure that a pattern is projected at the correct location on the substrate.

Figure 3:
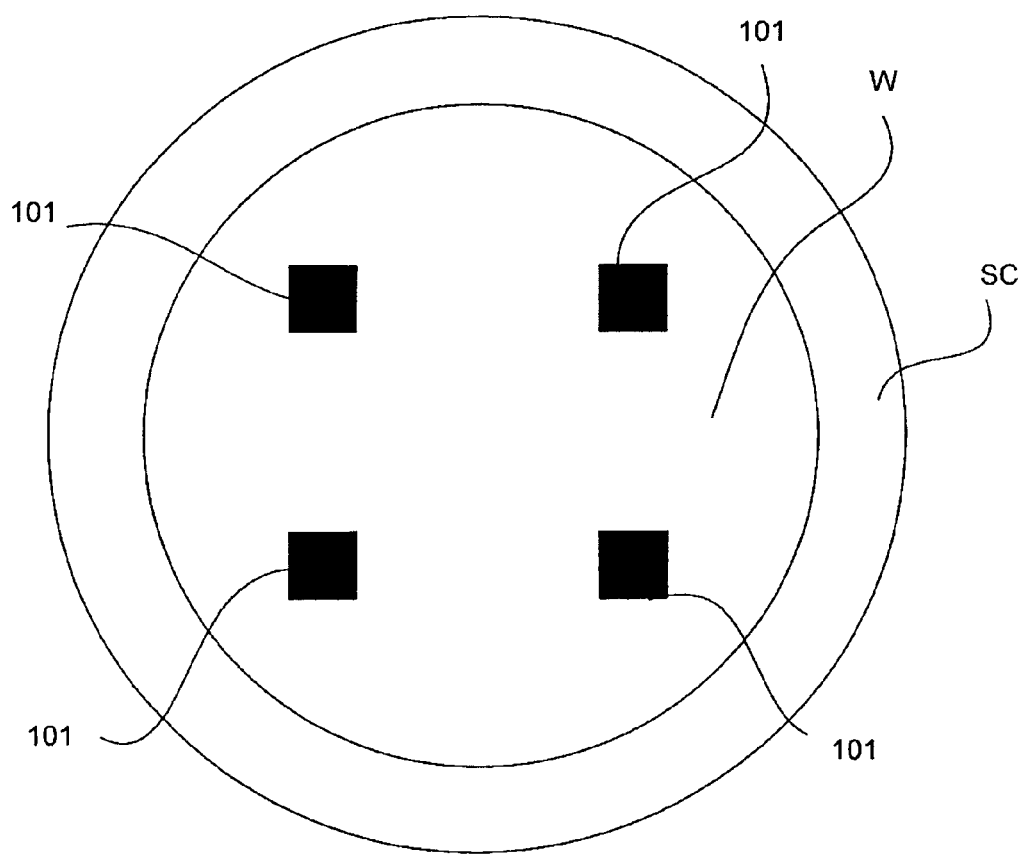
FIG. 3 depicts a substrate carrier and substrate.

FIG. 3 shows a plan view of a substrate carrier SC with a substrate W positioned on the substrate carrier SC. The substrate W is provided with a plurality of alignment marks 101 which are used to align the substrate within the lithographic apparatus. In some circumstances, it may be desirable to know the position of the substrate carrier SC, and the position of the substrate relative to the substrate carrier SC.

Figure 4A:
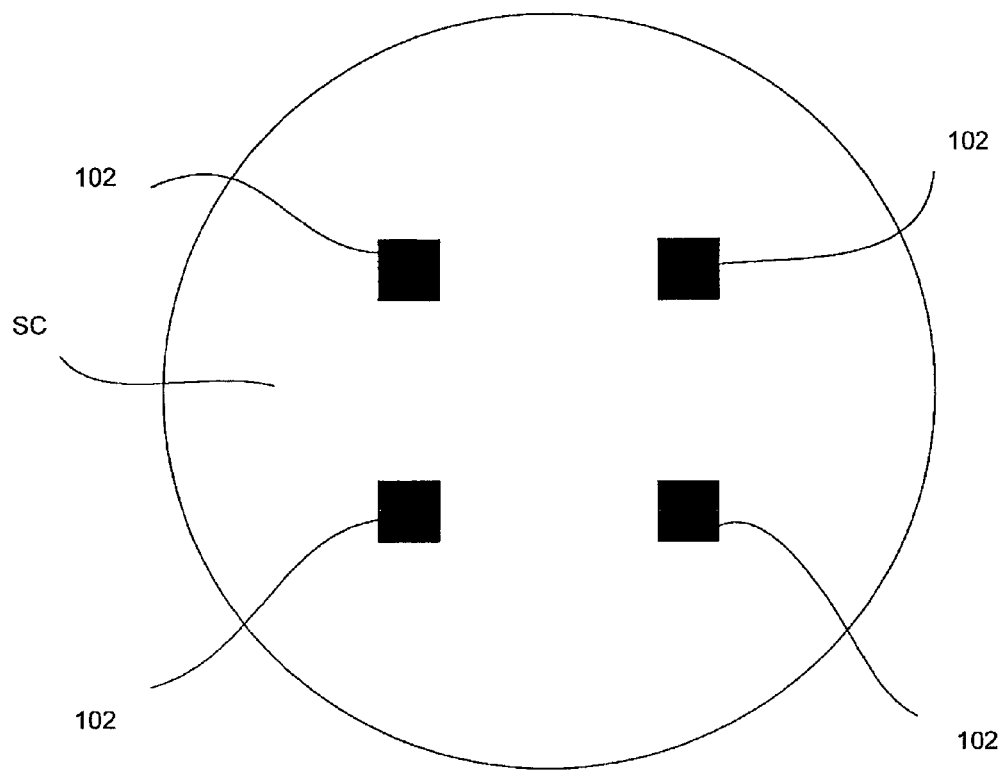
FIGS. 4a and 4b depict a substrate carrier according to an embodiment of the present invention.

FIG. 4a shows a substrate carrier SC according to an aspect of the present invention. The substrate carrier SC is provided with a plurality of alignment marks 102. As described above, a substrate W may be patterned while it is attached to a substrate carrier SC. Thus, the substrate carrier SC and substrate W move around the lithographic apparatus together. In order to ensure that the lithographic apparatus has been correctly set up to accommodate both the substrate W and the substrate carrier SC, it may be desirable to calibrate the lithographic apparatus using only the substrate carrier SC (i.e. with no substrate W positioned thereon). By providing alignment marks 102 on the substrate carrier SC, the alignment of the substrate carrier SC can be accurately determined. By positioning alignment marks 102 on a substrate carrier SC in the same position as alignment marks 101 would appear on a substrate W, existing alignment methods and devices used in the lithographic apparatus can be used to accurately determine the position of the substrate carrier SC (i.e. in the same way as the position or alignment of a substrate W would be determined). Existing alignment systems position the substrate W using alignment marks on the substrate. The alignment marks may be directly imaged to determine the position of the substrate, or the alignment marks may be used to generate, for example, a fringe pattern, the properties of which are used to determine the position of the substrate. Alignment systems are well known in the art, and will not be described in more detail here.

Figure 4B:
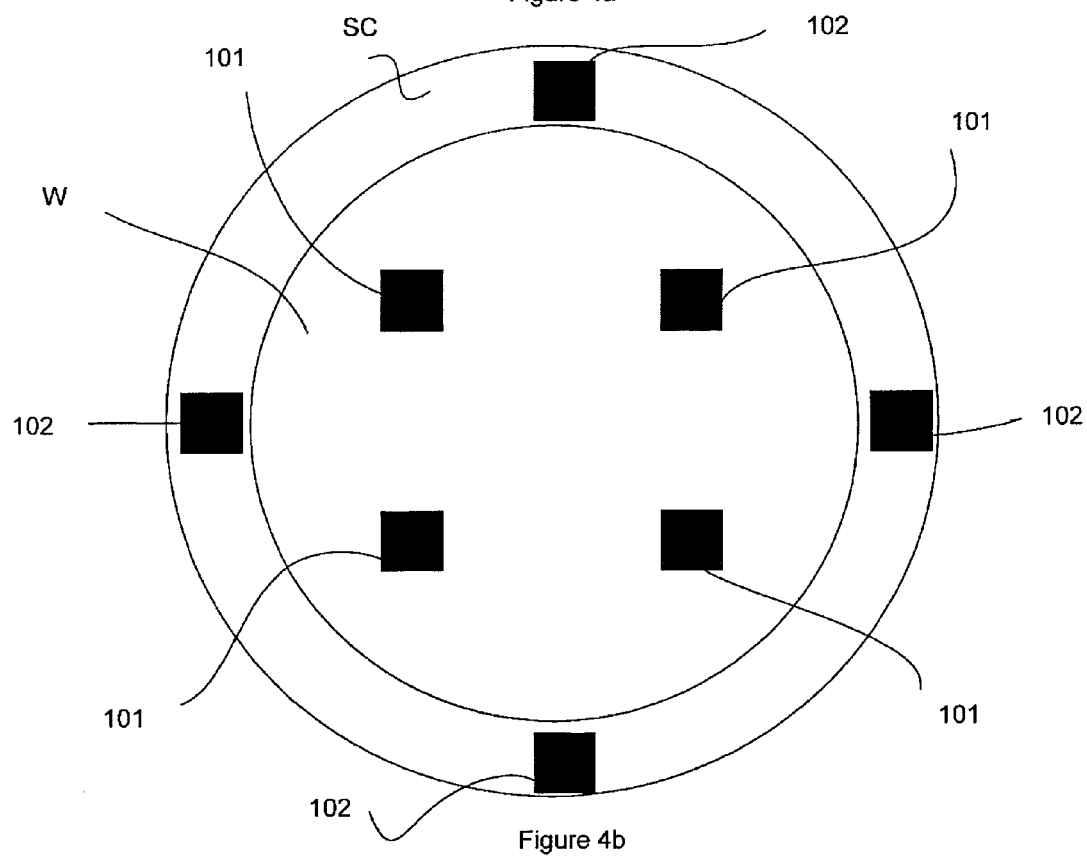

FIG. 4b shows a substrate carrier SC according to an aspect of the present invention with a substrate W positioned thereon. Both the substrate carrier SC and the wafer W have alignment marks 101, 102. Thus, the position of the substrate W relative to the substrate carrier SC can be ascertained. The alignment marks 102 on the substrate carrier SC may be located outside of the footprint of the substrate W, or may extend for example, from the middle of the substrate carrier SC to the outer edges of the substrate carrier SC. So long as the alignment marks on the substrate carrier SC are visible when the substrate W is positioned thereon, it will be possible to ascertain the relative position of the substrate W relative to the substrate carrier SC.

The alignment marks on the substrate carrier SC may be any suitable alignment marks. The position and type of alignment marks may be recognizable by the alignment devices used in the lithographic apparatus in which the substrate carrier SC is to be employed. The presence of alignment marks on both the substrate W and the substrate carrier SC make it possible to distinguish problems caused by the substrate carrier SC in general or problems caused by positioning of the substrate W on the substrate carrier SC. A unique identifier may also be added to each substrate carrier SC (where more than one substrate is used).

Figure 5A:
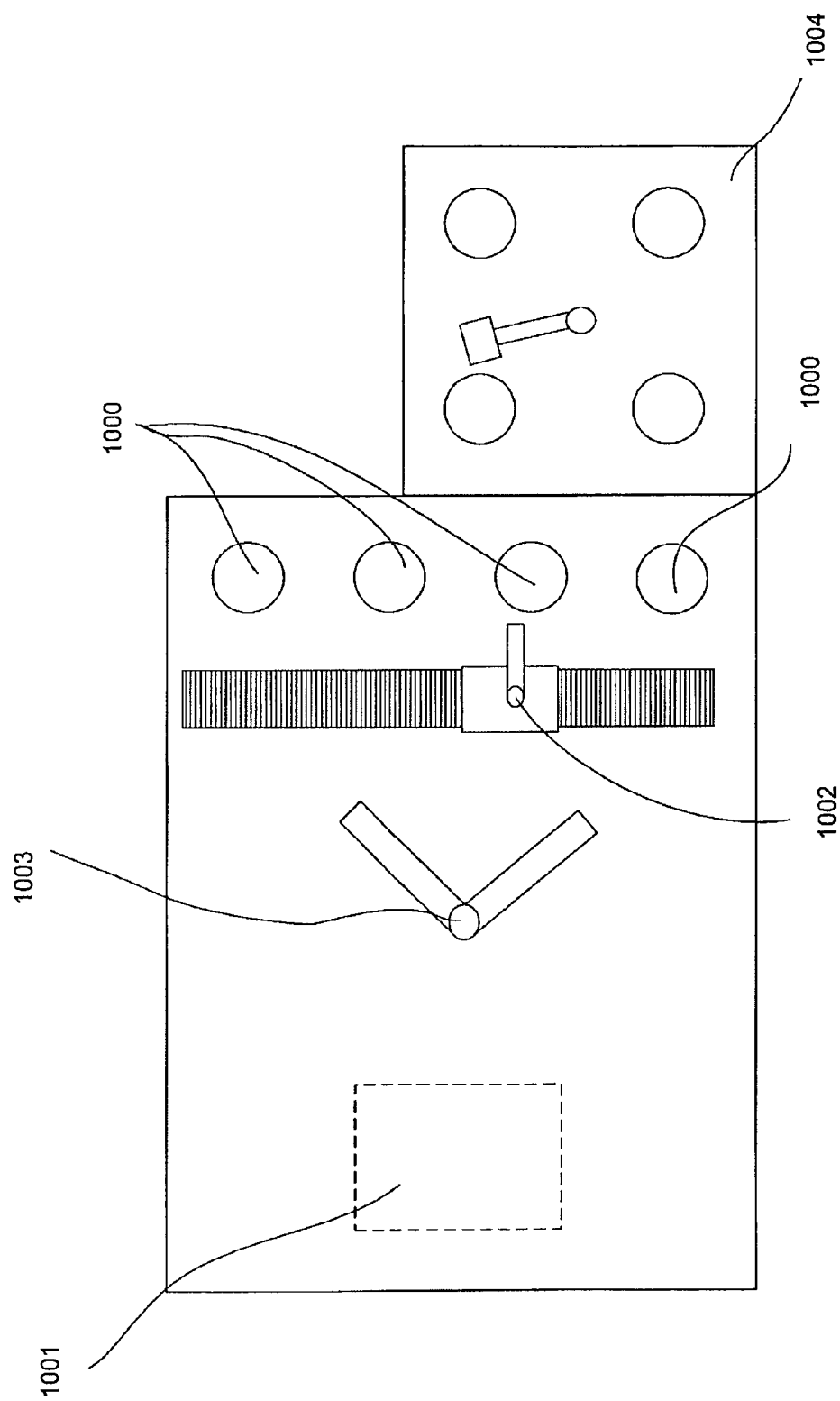
FIGS. 5a and 5b depict a lithographic apparatus according to an embodiment of the invention.

FIG. 5a schematically illustrates a lithographic apparatus according to an embodiment of the present invention. The lithographic apparatus of FIG. 5a shows only a few of the components used in a conventional lithographic apparatus, and is only given as an aid to understanding aspects of the present invention. FIG. 5a shows a plurality of substrate cassettes 1000 which contain substrates which have been exposed, or are about to be exposed in an exposure area 1001. A first robot handler 1002 loads and unloads substrates (not shown in FIG. 5a) from the substrate cassettes 1000, as well as providing substrates to a second robot handler 1003. The second robot handler 1003 moves substrates from the first robot handler 1002 to the exposure area 1001, and then from the exposure area 1001 to the first robot handler 1002. The robot handlers 1002, 1003 are independent, so that the first robot handler 1002 can be loading and unloading substrates while the second robot handler 1003 is moving the substrates to and from the exposure area 1001. This means that little exposure time is lost, since as soon as a substrate has been exposed and moved away by the second robot handler 1003, the first robot handler 1002 has unloaded a substrate from a cassette 1000 and moved it into position ready to be collected by the second robot handler 1003.

As described above, irregularly shaped substrates (e.g. very thin substrates or different shaped substrates) may be positioned on and then fixed to a substrate carrier. The substrate is then processed (i.e. moved around and exposed, etc.) in the lithographic apparatus while it is attached to the substrate carrier. The substrate carrier offers support to the substrate, and allows the substrate to be moved around simply by moving the substrate carrier (which is much more resilient to mechanical forces than the substrate itself, and can also be configured/made to handle bowed or warped substrates, or substrates having slots, cavities or rims located in or on the substrate). The substrate and substrate carrier may be treated as though they were a conventional substrate. It is conceivable that a plurality of different substrate carriers will be required to handle a range of substrates, for example those having different sizes or shapes. Even if the mechanism by which a substrate is attached to the substrate carrier is relatively quick, it still takes time and possibly a dedicated device to fix the substrate in position on the substrate carrier.

In FIG. 5a, the loading of substrates onto substrate carriers (and removal of substrates from substrate carriers) is undertaken by a dedicated substrate-to-substrate carrier apparatus 1004. Any irregular substrate which needs to be loaded onto a substrate carrier is loaded onto a substrate carrier in the substrate-to-substrate carrier apparatus 1004. When then this has been done, a cassette of substrate carriers with substrates positioned thereon may be dealt with by the robot handlers 1002, 1003 in the same way as a cassette of conventional substrates. The cassette of substrate carriers with substrates positioned thereon may be moved into a position easily accessibly to the robot handlers, i.e. in the position of one of the cassettes of substrates 1000 of FIG. 5a. By pre-loading a cassette of substrates that are already positioned on substrate carriers, no potential exposure time is wasted. Substrates may be loaded onto substrate carriers by the substrate-to-substrate carrier apparatus 1004 while exposure of other regular substrates is taking place in the lithographic apparatus.

Once a substrate positioned on a substrate carrier has been exposed in the exposure area, the robot handlers 1002, 1003 move it back to the substrate-to-substrate carrier apparatus 1004, where the substrate is removed from the carrier.

In providing the substrate-to-substrate carrier apparatus 1004, the exposure of substrates which are attached to a substrate carrier is seamless. The lithographic apparatus as a whole does not, in general function in any different way. The only thing which is different is that a cassette of substrates positioned on substrate carriers is provided to be exposed, as opposed to a cassette of conventional substrates. The substrate-to-substrate carrier apparatus 1004 (or other appropriate apparatus) may automatically detect when a substrate requires a substrate carrier, for example when the substrate is certain thickness or shape (i.e. irregular). This means that no input is required from an operator, the entire process of positioning the substrate onto a carrier, exposing the substrate and removing the substrate from the substrate carrier being automatic. The only action which may be required from an operator (or other machine) is the loading of the irregular substrates and substrate carriers into the substrate-to-substrate carrier apparatus 1004. Again, this can be automated.

It will be understood from the description of FIG. 5a that many processes are undertaken in parallel. Thus, a plurality of substrate carriers may be retained within the lithographic apparatus for simultaneous use. The number of carriers may correspond to the number of processes which may be undertaken in parallel (plus, perhaps, a few spare substrate carriers). For example, and at any one time, the following processes may be being undertaken: a first substrate may be being loaded onto a first substrate carrier in the substrate-to-substrate carrier apparatus 1004; a second substrate held in position on a second substrate carrier may be pre-aligned (i.e. coarsely aligned) prior to being moved to the exposure area 1001; a third substrate held in position on a third substrate carrier may be exposed in the exposure area 1001; a fourth substrate held in position on a fourth substrate carrier may be on its way back to the substrate-to-substrate carrier apparatus 1004 after being exposed; and a fifth substrate held in position on a fifth substrate carrier may be about to be removed from the substrate carrier in the substrate-to-substrate carrier apparatus 1004. It will be appreciated that in the example just given, five substrate carriers may be used simultaneously. However, one, two, three, four or any appropriate number of substrate carriers may be used and/or retained in the lithographic apparatus at any one time.

It will be appreciated that a cassette can be fully loaded with substrate carriers with substrates positioned thereon. Alternatively, a sub-set of a set of substrates could be loaded. For example, if the lithographic apparatus is provided with five substrate carriers, only five substrates from an initial larger set may be positioned on those carriers and loaded into the cassette. When a substrate from the cassette has been exposed and returned to the substrate-to-substrate carrier apparatus 1004 where it is removed from the substrate carrier, another substrate from the same larger set may be positioned on the same substrate carrier.

In the above mentioned embodiment, the substrate-to-substrate carrier apparatus 1004 loads substrates onto substrate carriers, and then the substrate carriers with substrates positioned thereon are loaded into cassettes for eventual exposure in the exposure area 1001. It will be appreciated that a simpler approach could be undertaken, whereby the substrate-to-substrate carrier apparatus 1004 loads a substrate onto a substrate carrier and then passes the substrate carrier with the substrate positioned thereon to a position accessible to the first robot handler 1002. The substrate carrier with a substrate positioned thereon may be placed onto a support (sometimes referred to as a 'track pedestal') within the lithographic apparatus, which could be located in the position of one of the cassettes 1000. The track pedestal could be provided with a vacuum source to hold the substrate carrier in position. The vacuum source could also be used to maintain the vacuum in a substrate carrier which uses a vacuum to hold a substrate in position (as described above).

After the substrate carrier with the substrate positioned thereon has been placed on the track pedestal, the first robot handler 1002 would then move the substrate carrier with the substrate positioned thereon to the second robot handler 1003, which would then move the substrate carrier and substrate to the exposure area 1001. This approach is simpler than the embodiment described above, because the substrate carrier with the substrate positioned thereon is not placed into and then subsequently removed from a cassette, but is instead placed directly onto the track pedestal. This may negate the need to modify the cassettes to accommodate the substrate carrier with the substrate positioned thereon (although this may not always be necessary).

If the above described simpler approach was implemented in the system of FIG. 5a, two of the cassettes could be replaced with track pedestals. The remaining two cassettes could contain regular substrates not requiring positioning on a substrate carrier. Substrate carriers with substrates positioned thereon could be transferred from the substrate-to-substrate carrier apparatus 1004 using one of the two track pedestals, and transferred back to the substrate-to-substrate carrier apparatus 1004 using the other of the two track pedestals, so that that there is little or no delay in transferring substrate carriers with substrates positioned thereon to and from the substrate-to-substrate carrier apparatus 1004.

Figure 5B:
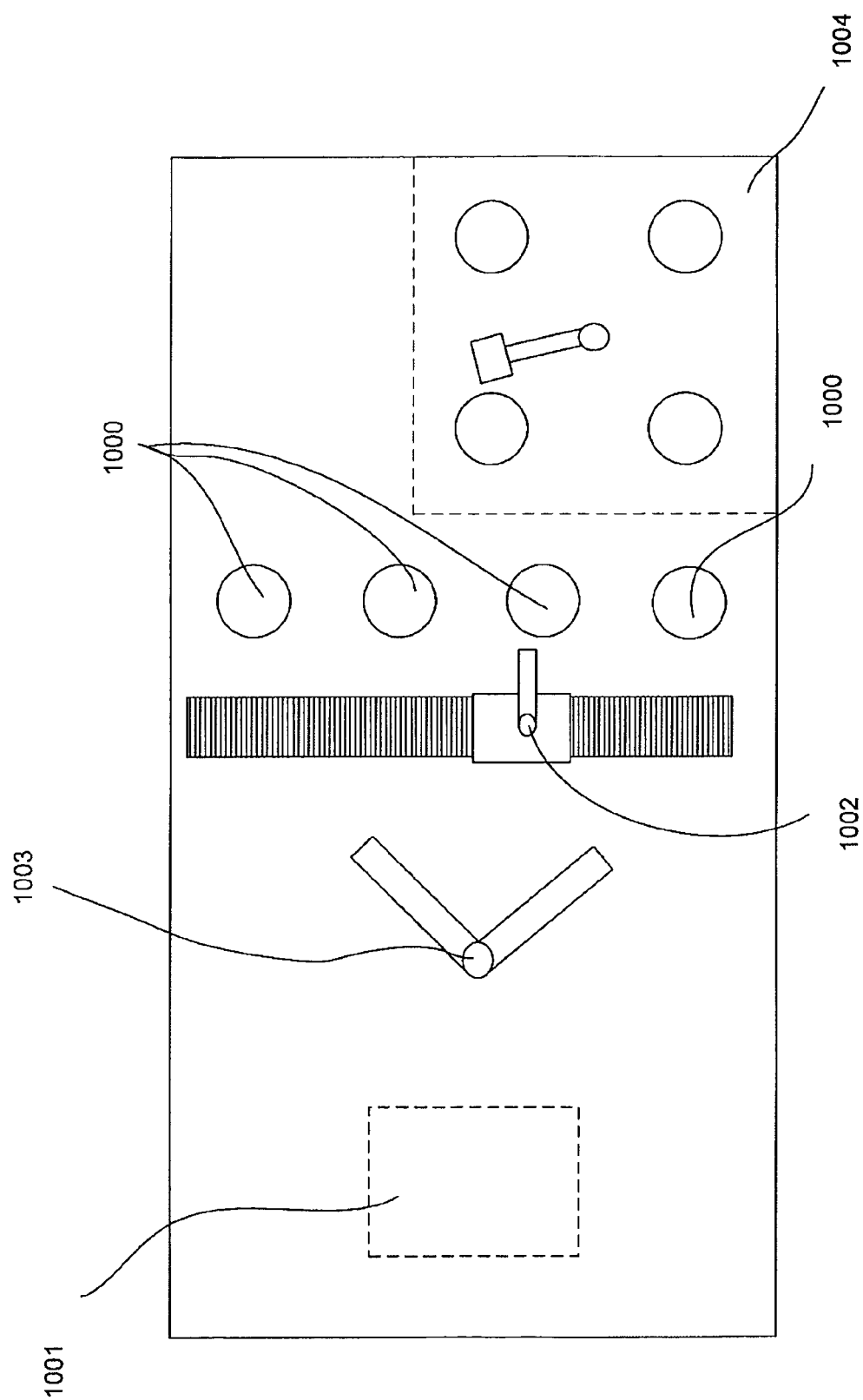

The dedicated substrate-to-substrate carrier apparatus 1004 may be located provided as a separate unit, connectable to the area where substrates are handled and exposed. Alternatively, as shown in FIG. 5b, the substrate-to-substrate carrier apparatus 1004 may be provided in the same housing as the area where substrates are handled and exposed.

In the apparatus described with reference to FIGS. 5a and 5b, the substrates are attached to the substrate carriers using a vacuum, as described above in relation to FIG. 2a. The substrate table ST of FIG. 2a can then be used to maintain or 'top-up' that vacuum. Alternatively, substrates may be held in position on the substrate carriers using other means, such as an electrostatic force, mechanical clamping or any other arrangement whereby the substrate can be releasably secured in position on the substrate carrier and easily released from the substrate carrier. It will be understood that the method of bonding or gluing of a substrate to a substrate carrier is not considered to be a method of releasably securing.

Processes undertaken on the substrates positioned on the substrate carriers may be undertaken outside of the exposure area, and inside the substrate-to-substrate carrier apparatus 1004. For example, alignment of the substrates relative to the substrate carriers may be undertaken in the substrate-to-substrate carrier apparatus 1004. It will be appreciated that before being loaded into the substrate-to-substrate carrier apparatus 1004 for positioning onto substrate carriers (and after being removed from the substrate-to-substrate carrier apparatus 1004), the substrates may undergo processing steps such as cleaning, etching, etc.

It will be appreciated that the substrate-to-substrate carrier apparatus 1004 may be incorporated into existing lithographic apparatus, or provided with newly constructed lithographic apparatus. The substrate-to-substrate carrier apparatus 1004 may be a completely independent structure which can be connected to an existing lithographic apparatus (i.e. it can be constructed, transported and sold separately to the part of the lithographic apparatus which exposes the substrates). A suitable machine which could potentially fulfill the functional requirements of the substrate-to-substrate carrier apparatus 1004 is manufactured by Mechatronic, of Austria. Although this machine is suitable (with some modifications to account for the size of the substrate carriers and substrates), it is at the present time not being used for the purpose indicated herein, but for positioning microscope slides under microscopes. It will be appreciated, however, that any apparatus may function as the substrate-to-substrate carrier apparatus 1004, so long as the machine is suitable for handling and maneuvering irregular (e.g. thin, or oddly shaped) substrates.

With regards to the alignment of a substrate in a lithographic apparatus, conventional alignment techniques typically use optical measurement techniques that measure the position of alignment marks provided on the top side of the substrate, i.e. the side of the substrate that does not face the substrate table on which the substrate is positioned. This makes it difficult to use these alignment techniques in combination with devices fabricated from both sides since, in that case, a substrate needs to be positioned such that the alignment marks face the substrate table.

In the event immersion techniques are used, the optics of the alignment system are usually positioned outside the area filled with liquid, so the optics and/or the optical signals need to be guided into the liquid. This is not an easy task and requires complicated and expensive techniques.

In order to overcome these and other problems, alignment techniques have been developed that are arranged to measure the position of an alignment mark provided on the back-side of the substrate, i.e. the side of the substrate facing the substrate table and the side that is not exposed. This side will also be referred to as the second side of the substrate.

During alignment, the second side faces the substrate table that supports the substrate. In order to allow measuring the position of the alignment marks provided on the second side of the substrate, optical devices are provided in and/or about the substrate table. This technique is generally referred to as backside alignment, and is known in the art. A description of backside alignment can be found in U.S. Pat. No. 6,768,539.

It will be appreciated that if the substrate to be exposed needs to be positioned on a substrate carrier (for example, on one of the substrate carriers described above) because the substrate is thin or irregularly shaped, the substrate carrier will cover any alignment marks, making backside alignment difficult, if not impossible.

According to an aspect of the present invention there is therefore provided a substrate carrier with windows provided therein. The windows may be provided in any of the substrate carriers mentioned above, or any other suitable substrate carrier (e.g. a substrate carrier employing electrostatic forces or mechanical clamping to hold a substrate in position). The windows in the substrate carrier allow the alignment marks provided on the second side of the substrate to be visible to (i.e. viewed by) the optical devices located in or about the substrate table. The position of the windows in the substrate carrier will correspond to the position of the alignment marks positioned on the second side of the substrate. For example, the substrate table may be provided with four windows, each corresponding to the position of one of four alignment marks on the second side of the substrate. The substrate carrier may be provided with more than one set of windows, each of which may correspond to a specific configuration of alignment marks (e.g. different size substrates may have alignment marks in different places). In providing the substrate carrier with windows, the substrate carrier can be used when backside alignment is required. It will be appreciated that the 'windows' referred to herein are sometimes given different names, such as 'access ports' or 'ports'.

It will be appreciated that since substrate carriers are readily removable from the lithographic apparatus and introducible to the lithographic apparatus, they may be easily cleaned, repaired maintained, etc. If a certain substrate carrier needs to be removed from the lithographic apparatus, another can readily take its place, meaning that the lithographic apparatus need not be turned off, or at least not for a long period of time. This means that exposure of substrates can continue. This is in stark contrast to the situation where the comparatively large and bulky substrate table WT has to be cleaned, repaired maintained, etc., when the lithographic apparatus needs to be completely shut-down, often for a long period of time. This means that exposure of substrates cannot continue, reducing throughput and increasing costs.

While specific embodiments of the invention have been described above, it will be appreciated that the invention may be practiced otherwise than as described. The description is not intended to limit the invention. The invention is limited by the claims, which follow.

What is claimed is:

1. A substrate carrier arranged to hold a substrate in position using a vacuum, the substrate carrier having a surface portions provided with an array of burls for supporting the substrate and defining a sealed space between other surface portions of the substrate carrier and the substrate, the vacuum being established in the sealed space created between the substrate carrier and the substrate, wherein a valve is provided in the substrate carrier for evacuation of air from the space between the substrate carrier and the substrate, and wherein the substrate carrier is configured to substantially maintain the vacuum even when the substrate carrier is not connected to a vacuum source.

2. A substrate carrier as claimed in claim 1, wherein the sealed space between the substrate carrier and the substrate is formed when the substrate is positioned on the substrate carrier.

3. A substrate carrier as claimed in claim 1, wherein the burls are between about 5 μm and about 50 μm high.

4. A substrate carrier as claimed in claim 1, wherein the burls are between about 100 μm and about 500 μm in diameter.

5. A substrate carrier as claimed in claim 1, wherein the pitch of burls in the array is between about 0.5mm and about 2mm.

6. A substrate carrier as claimed in claim 5, wherein the pitch of burls in the array is about 1mm.

7. A substrate carrier as claimed in claim 1, wherein the substrate carrier is provided with a seal which extends around the array of burls.

8. A substrate carrier as claimed in claim 7, wherein the substrate carrier is provided with a further seal that extends around the array of burls and defines a space between the seal and the further seal.

9. A substrate carrier as claimed in claim 8, wherein the space between the substrate and the substrate carrier is connected to the space provided between the seal and further seal by one or more apertures.

10. A substrate carrier as claimed in claim 1, wherein the valve is a one-way valve.

11. A substrate carrier as claimed in claim 1, wherein a space is provided within the body of the substrate carrier.

12. A substrate carrier as claimed in claim 11, wherein the space between the substrate and the substrate carrier is connected to the space provided within the body of the substrate carrier by one or more apertures.

13. A substrate carrier as claimed in claim 12, wherein the apertures are between about 0.5mm and about 1.5mm in diameter.

14. A substrate carrier as claimed in claim 13, wherein the apertures are about 0.9mm in diameter.

15. A substrate carrier as claimed in claim 12, wherein the valve is provided in the substrate carrier for evacuation of air from the space within the body of the substrate carrier.

16. A substrate carrier as claimed in claim 11, wherein the substrate carrier is provided with a seal that extends around an array of burls, a further seal that also extends around the array of burls and defines a space between the seal and the further seal, and wherein the space between the seal and the further seal is connected to the space provided in the substrate carrier.

17. A substrate carrier as claimed in claim 11, wherein the substrate carrier is provided with columns that are located within the space provided within the body of the substrate carrier, and wherein the columns extend across the space to reinforce the substrate carrier.

18. A substrate carrier as claimed in claim 1, wherein the substrate carrier is arranged to be connected to the vacuum source.

19. A substrate carrier as claimed in claim 18, wherein the valve is a one-way valve, and the substrate carrier is arranged to be connected to the vacuum source via the one-way valve.

20. A substrate carrier as claimed in claim 1, wherein the vacuum source is arranged to be provided by a substrate table of a lithographic apparatus.

21. A substrate carrier as claimed in claim 1, wherein the substrate carrier is provided with a plurality of sealed spaces.

22. A method of releasably securing a substrate to a substrate carrier comprising:

positioning a substrate on an array of burls provided on surface portions of the substrate carrier so that a sealed space is defined between the substrate and other surface portions of the substrate carrier; and connecting the substrate carrier to a vacuum source via a valve in the substrate carrier to establish a vacuum in the space between the substrate and the other surface portions of the substrate carrier, wherein the vacuum is substantially maintained even when the substrate carrier is not connected to the vacuum source.

23. A method of releasably securing a substrate to a substrate carrier as claimed in claim 22, wherein the valve is a one-way valve, and wherein the substrate carrier is connected to the vacuum source via the one-way valve in the substrate carrier.

24. A method of releasably securing a substrate to a substrate carrier as claimed in claim 22, wherein the vacuum source is provided by a substrate table that supports the substrate carrier.

25. A method of releasably securing a substrate to a substrate carrier as claimed in claim 22, wherein the vacuum is increased or maintained by connecting the substrate carrier to the vacuum source to increase or maintain the vacuum in the space between the substrate and the substrate carrier.

26. A method of releasably securing a substrate to a substrate carrier as claimed in claim 22, wherein a plurality of substrates are positioned on the substrate carrier so that a plurality of sealed spaces are defined between the substrate and the substrate carrier.

27. A method of releasably securing a substrate to a substrate carrier as claimed in claim 22, further comprising removing the substrate carrier from the vacuum source; and substantially maintaining the vacuum in the space between the substrate and the other surface portions of the substrate carrier.

28. A lithographic processing method comprising:

positioning a substrate on an array of burls provided on surface portions of a substrate carrier so that a sealed space is defined between the substrate and other surface portions of the substrate carrier;

introducing the substrate and substrate carrier into a lithographic apparatus while the substrate is held in position on the substrate carrier using a vacuum applied to the sealed space;

applying a pattern to the substrate using optical lithography; and removing the substrate and substrate carrier from the lithographic apparatus while the substrate is still held in position on the substrate carrier using the vacuum.

29. A lithographic processing method as claimed in claim 28, wherein the method further comprises subsequently processing the substrate while the substrate is attached to the substrate carrier.

30. A lithographic processing method as claimed in claim 28, wherein the method further comprises processing the substrate while the substrate is attached to the substrate carrier before said introducing the substrate and the substrate carrier into the lithographic apparatus.

* * * * *